United States Patent [19]
Malone et al.

[11] Patent Number: 5,614,835
[45] Date of Patent: Mar. 25, 1997

[54] METHOD AND APPARATUS FOR HANDLING A PACKAGED INTEGRATED CIRCUIT DEVICE FOR TESTING

[75] Inventors: Robert Malone, Westford, Mass.; Brian G. Beucler, Sandown, N.H.

[73] Assignee: Analog Devices, Inc., Norwood, Mass.

[21] Appl. No.: 484,346

[22] Filed: Jun. 7, 1995

[51] Int. Cl.$^6$ ................................................. G01R 31/02
[52] U.S. Cl. .............................................................. 324/755
[58] Field of Search .................................. 324/755, 754, 324/768, 158.1, 73.1; 439/66, 68, 70

[56] References Cited

U.S. PATENT DOCUMENTS

| | | | |
|---|---|---|---|
| 2,524,939 | 10/1950 | Stephan et al. | 324/158.1 |
| 3,408,612 | 10/1968 | Bute et al. | 324/158.1 |
| 4,862,076 | 8/1989 | Renner et al. | 324/755 |
| 4,912,401 | 3/1990 | Nady, II et al. | 324/755 |
| 4,922,191 | 5/1990 | Conover | 324/755 |
| 4,947,111 | 8/1990 | Higman et al. | 324/755 |
| 4,950,980 | 8/1990 | Pfaff | 324/755 |
| 5,038,101 | 8/1991 | Murphy | 324/755 |
| 5,453,695 | 9/1995 | Sparling et al. | 324/755 |

*Primary Examiner*—Vinh P. Nguyen
*Attorney, Agent, or Firm*—Hale and Dorr

[57] ABSTRACT

A carrier is used to couple a packaged device having leads of a certain length to a testing device. The carrier includes an adapter for receiving packaged dies with leads that are cut so that they are otherwise too short for the testing device. The adapter thus allows the leads to be cut prior to testing.

19 Claims, 2 Drawing Sheets

METHOD AND APPARATUS FOR HANDLING A PACKAGED INTEGRATED CIRCUIT DEVICE FOR TESTING

FIELD OF THE INVENTION

This invention relates to a system and method for handling and testing an integrated circuit package.

BACKGROUND OF THE INVENTION

One type of packaged integrated circuit includes a die that is hermetically sealed inside a metal package. This package has a generally cylindrical body with a closed top and a flange around the bottom. The die is bonded to a base plate, which is welded to the flange so that the body and base plate enclose the die. The die has long flexible wirebond leads that extend through base plate openings, which are hermetically sealed with glass. The packaged die is inserted into a carrier which, in turn, is inserted into a device for electrically testing the die.

Some end users of such packaged dies mount them on a circuit board and then cut the leads after mounting. Other end users require that the packaged dies be provided with shortened leads that do not need to be cut. Because typical testing equipment requires that the leads have a certain length, dies with substantially shortened leads cannot be tested in the usual manner. Consequently, if the end user requires shortened leads, the packaged die is electrically tested with its long leads, and then the leads are cut to the required length.

SUMMARY OF THE INVENTION

According to the present invention, a carrier is adapted so that a packaged device with substantially shortened leads can be tested after the leads are cut. Otherwise, the cutting of leads could potentially affect the device (e.g., by causing a wirebond inside the package to become broken or disconnected) after the die has been tested. Even though it is unlikely that a wirebond will break, some devices, such as accelerometers for use in air bag switches, should have minimal likelihood of failure. Accordingly, an adapted carrier prevents post-testing damage from cutting.

The carrier has a support platform with openings for receiving the packaged die so that the uncut leads of the die extend from the carrier a sufficient length to permit electrical connection of the leads to the testing equipment. The carrier preferably has an arrangement of insulating fins for physically and electrically separating the leads.

In one embodiment, a support platform portion of a carrier is removed and an adapting socket is provided in the carrier. The adapting socket has a plurality of receptacles at one end for receiving shortened leads of a device, and a plurality of leads extending from another end of the socket. The socket leads extend from the carrier to the same length that the leads of the device would have extended without being cut. When a device with shortened leads is inserted into the socket and the carrier is inserted in the testing device, the testing device may be connected to the socket leads to test the packaged circuitry.

In another embodiment, pin receptacles are inserted in each of the openings in the support platform of the carrier. Each pin receptacle has one end configured to receive a shortened lead and a receptacle lead at the other end extending downward through the carrier so that it extends the same length that the leads of the device would have extended without being cut.

In a method according to the present invention, leads of a packaged device are first cut to a substantially shortened length suitable for mounting on a circuit board without further cutting. With these shortened leads, testing would not be possible with a typical carrier. The packaged device with shortened leads is inserted into an adapting means in the carrier. The carrier is then inserted in a device that electrically tests the device enclosed in the package.

According to the present invention, a hermetically packaged device can be electrically tested and can have its leads cut to specifications desired by an end user, without altering the device after testing. By using an adapted carrier to perform the testing, testing can be performed after the leads are cut, which it not possible with a typical carrier. Thus the present invention provides a simple and convenient way to test a packaged device, with less risk of damage after testing. Other features and advantages will become apparent from the following detailed description, when read in conjunction with the drawings, and from the appended claims.

DETAILED DESCRIPTION

The present invention is a method and apparatus for handling and testing a packaged device in standard testing equipment after leads of the packaged device have been cut to a substantially shortened length suitable for mounting on a circuit board without further testing. With the shortened leads, testing otherwise would not be possible with a typical carrier. While the present invention is described in terms of a carrier and accompanying components for use with a ten-lead TO-100 package, the system and method in the present invention can be used with other types of packages, and with different numbers of leads.

Figure 1:
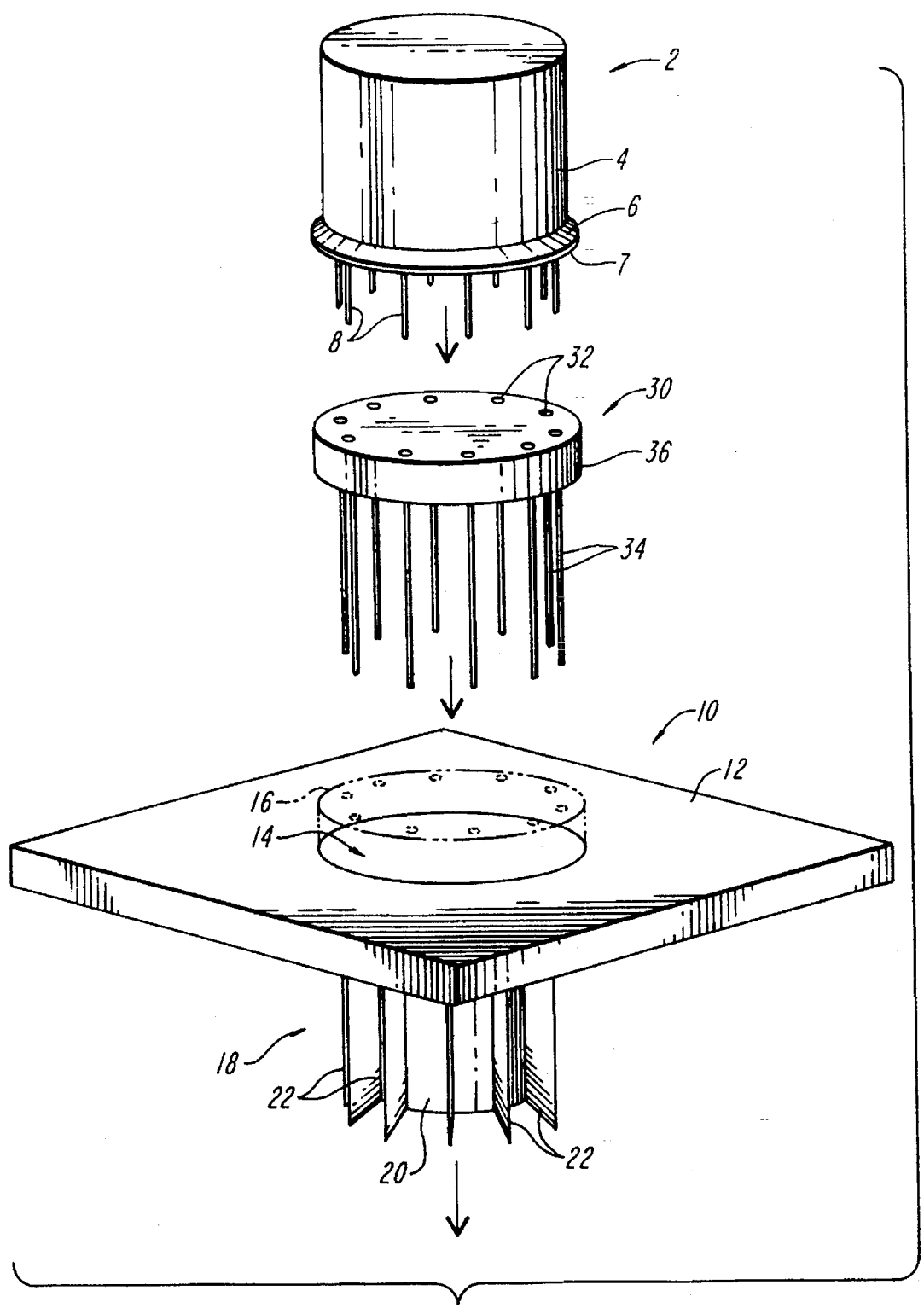
FIG. 1 is an exploded perspective view of a packaged device, a socket, and a carrier according to a first embodiment of the present invention.

Referring to FIG. 1, a hermetic metal package 2 has a generally cylindrical body 4 with an enclosed top and a flange 6 at its base. A device is bonded to a base plate 7 having openings (not shown), and the base plate is welded to the flange. Wire leads 8 extend downwardly from the device through the openings. The openings are sealed with glass. These leads are substantially equal in length and are cut from an initial length of about 0.75 inches to a substantially shorter length of about 0.15 to 0.20 inches, a length at which testing cannot be performed with typical testing carriers. At this shorter length, the leads do not need to be cut when the device is mounted on a circuit board.

A carrier 10 for supporting package 2 for testing includes a planar support 12 having an opening 14. Extending upward from support 12 of a typical known carrier is a support platform 16 (shown in phantom). Extending downward from support 12 is a separator 18 that includes a central post 20, and radially extending fins 22. These fins are made of an insulating material, such as plastic, to physically and electrically separate the leads of the packaged device. In a conventional system, a packaged device is mounted on support platform 16 so that the leads of the device extend a certain length along the fins.

In a typical carrier, the planar member is about 0.75 inches wide by 1.0 inches long, and about 0.10 inches thick. The support platform extends up about 0.15 inches and the fins extend down about 0.55 inches, so that the total height is about 0.80 inches for leads that are typically 0.75 inches.

According to a first embodiment of the present invention, support platform 16 is removed and an adaptive socket 30 is inserted into opening 14. Socket 30 has a body 36 with receptacles 32 on a top side of the body and leads 34 extending downward from a bottom side of the body. Leads 34 are designed to have a length such that when socket 30 is inserted into opening 14, leads 34 extend the same length that uncut leads from a typical package would normally extend. Body 36 is a little longer than the substantially shortened leads 8 of the packaged device to accommodate the leads. When the packaged device is inserted in socket 30, the leads of the device make electrical contact with socket leads 34.

In a testing method based on this first embodiment, the leads of the packaged device are cut to a shortened length, preferably about 0.15–0.20 inches, and the packaged device is inserted into the socket in the carrier. The assembled packaged device, socket, and carrier are inserted into a device for electrical testing.

Figure 2:
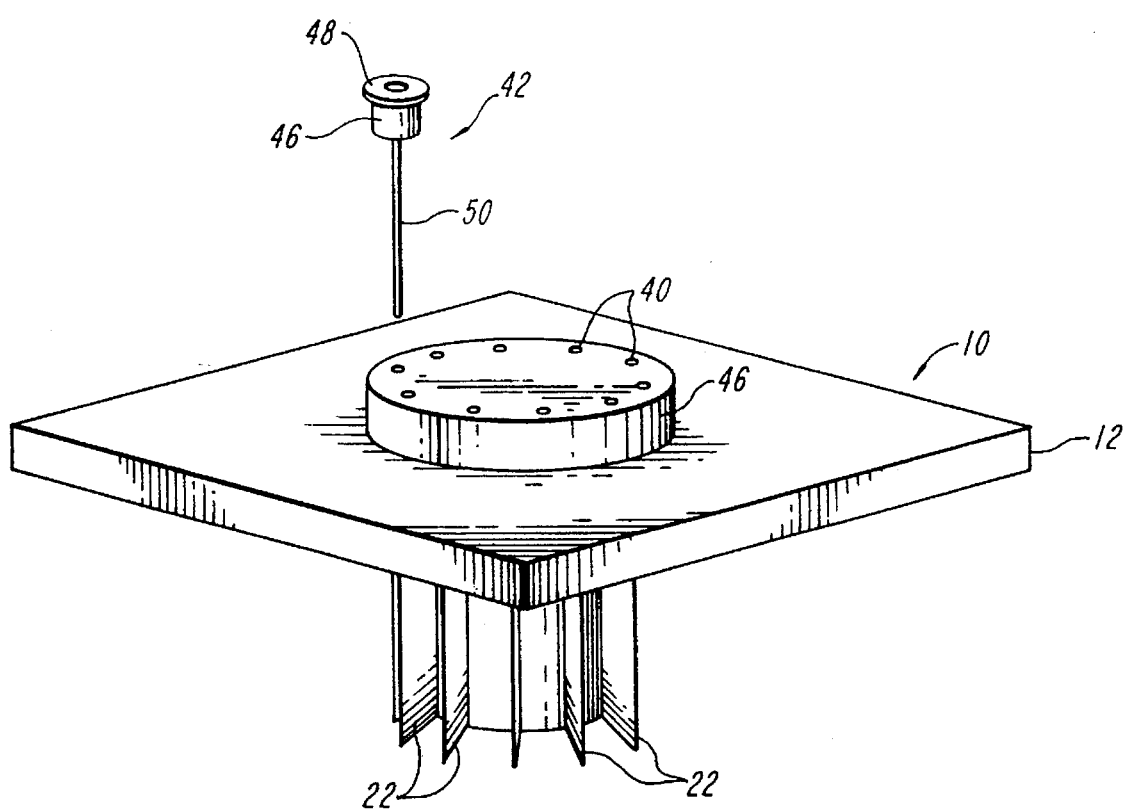
FIG. 2 is a perspective view of a carrier with pin receptacles according to a second embodiment of the present invention.

Referring to FIG. 2, in a second embodiment of the present invention, carrier 10 has a support platform 46 with openings 40 for receiving leads from a packaged device. Individual pin receptacles 42 are inserted into each of the openings 40. Known pin receptacles such as those available from Mill-Max Manufacturing Corp., located in Oyster Bay, N.Y., which are currently used for making prototype circuits, can be used. To use such pin receptacles, openings 40 in support platform 46 may need to be drilled to a wider diameter. More preferably, however, pin receptacles 42 are sized to fit into openings 40 without altering the carrier.

Each pin receptacle 42 has a cylindrical body 46 with a top end having an opening and a flange 48 that is wider than opening 40 at the top of body 46. Body 46 is long enough to receive a lead from a typical packaged device shortened for mounting on a circuit board. Pin receptacle 42, in turn, has a lead 50 extending downward from body 46. Lead 50 is sized to an appropriate length such that it extends downward along fins 22 of the carrier to about the same length that an uncut lead of a packaged die would have extended.

A method according to this second embodiment is similar to that of the first embodiment. The leads of the packaged device are first cut to a substantially shortened length and are then inserted into pin receptacles 42 in carrier 10. The carrier is inserted into the testing device for electrical testing.

Having described embodiments of the present invention, it should be apparent that other modifications can be made without departing from the scope of the invention as defined by the appended claims. For example, the number of pin receptacles or the number of receptacles in a socket can be altered in terms of number and/or configuration to adapt to a different type of package device.

What is claimed is:

1. An apparatus for handling and testing a packaged integrated circuit device in a testing device, the testing device requiring that the packaged device have leads of a certain length, the apparatus comprising:

a carrier for insertion in the testing device, the carrier having receptacle means designed to receive leads of a packaged device having the certain length; and means for adapting the carrier for a packaged device having leads that are substantially shorter than the certain length, such that the testing device would otherwise be unable to test the packaged device with the substantially shorter leads, the adapting means including:

means for receiving the substantially shortened leads, and leads, extending the certain length along the carrier, and electrically coupled to the receiving means.

2. The apparatus of claim 1, wherein the adapting means includes a one-piece socket having a body, the means for receiving including openings at one end of the body, and the leads extending the certain length are socket leads at another end of the body, such that when the socket is inserted into the carrier, the socket leads extend for the certain length.

3. The apparatus of claim 2, wherein the means for receiving the substantially shortened leads is sized to accommodate shortened leads that are about 0.15 to 0.20 inches long.

4. The apparatus of claim 1, wherein the carrier has a plurality of openings, and the adapting means includes a plurality of separate pin receptacles, each of which is inserted into one of the openings of the carrier and includes a lead that extends the certain length.

5. The apparatus of claim 4, wherein the means for receiving the substantially shortened leads is sized to accommodate shortened leads that are about 0.15 to 0.20 inches long.

6. A method for testing a packaged integrated circuit device in a testing system including a carrier for receiving a packaged device with leads extending a certain length relative to the package, and a testing device for receiving the carrier and for testing the packaged device, the method comprising the steps of:

(a) cutting the leads of a packaged integrated circuit device to a length that is less than the certain length;

(b) inserting the packaged device with the cut leads in an adapter;

(c) inserting the adapter in the carrier; and (d) inserting the carrier in the testing device to test the packaged device.

7. The method of claim 6, wherein step (a) includes cutting the leads from about 0.75 to about 0.15–0.20 inches.

8. The method of claim 6, the adapter including a plurality of individual pin receptacles, wherein step (b) includes the step of inserting the leads of the packaged device into the plurality of individual pin receptacles.

9. The method of claim 6, the adapter including a one-piece socket having receptacles and leads, wherein step (b) includes the step of inserting the leads of the packaged device into the one-piece socket.

10. The method of claim 6, wherein step (a) includes cutting the leads to a length at which the packaged device can be mounted on a circuit board without further cutting.

11. The method of claim 10, the adapter including a plurality of individual pin receptacles, wherein step (b) includes the step of inserting the leads of the packaged device into the plurality of individual pin receptacles.

12. The method of claim 10, the adapter including a one-piece socket having receptacles and leads, wherein step (b) includes the step of inserting the leads of the packaged device into the one-piece socket.

13. In combination, a packaged device having leads with a first length; and an apparatus for handling packaged devices for testing in a testing device and including:

a carrier for insertion in the testing device, the carrier designed to receive packaged devices with leads having a second length, the first length being less than the second length such that the testing device would otherwise be unable to test packaged devices with leads with the first length, the carrier having downwardly extending fins made of an electrically insulating material for separating the leads from each other; and an adapter having adapter leads extending the second length and a receptacle for receiving the packaged device having leads with the first length and for electrically coupling the leads of the packaged device to the adapter leads.

14. The combination of claim 13, wherein the adapter includes a single piece socket having the adapter and the receptacle openings for receiving the leads of the packaged device.

15. The combination of claim 13, wherein the adapter includes a plurality of separate pin receptacles, each having a receptacle and a lead extending the second length.

16. The combination of claim 13, wherein the packaged device has leads arranged in a circle, and wherein the fins are radially oriented.

17. An apparatus for handling a packaged integrated circuit device for testing in a testing device that requires the packaged device to have leads of a certain length, the apparatus comprising:

a carrier for insertion in the testing device, the carrier being designed to receive packaged devices with leads having the certain length; and an adapter having receptacle openings sized to receive a packaged device with leads that are substantially shorter than the certain length such that the testing device would otherwise be unable to test the packaged device, the adapter having leads extending the certain length along the carrier and being electrically coupled to the receptacle openings.

18. The apparatus of claim 17, wherein the adapter includes a single-piece socket with one receptacle opening for each lead of the packaged device.

19. The apparatus of claim 17, wherein the adapter includes a plurality of separate pin receptacles.

* * * * *